(12) United States Patent
Uzoh et al.

(10) Patent No.: US 9,666,514 B2
(45) Date of Patent: May 30, 2017

(54) HIGH PERFORMANCE COMPLIANT SUBSTRATE

(71) Applicant: Invensas Corporation, San Jose, CA (US)

(72) Inventors: Cyprian Emeka Uzoh, San Jose, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/686,671

(22) Filed: Apr. 14, 2015

(65) Prior Publication Data

US 2016/0307824 A1  Oct. 20, 2016

(51) Int. Cl.
| | |
|---|---|
| *H05K 1/00* | (2006.01) |
| *H01L 23/498* | (2006.01) |
| *H01L 21/48* | (2006.01) |
| *H01L 23/538* | (2006.01) |
| *H01L 23/15* | (2006.01) |

(52) U.S. Cl.
CPC ........ *H01L 23/498* (2013.01); *H01L 21/4846* (2013.01); *H01L 23/49838* (2013.01); *H01L 23/5384* (2013.01); *H01L 23/5387* (2013.01); *H01L 23/15* (2013.01); *H01L 23/49866* (2013.01); *H05K 2201/10378* (2013.01)

(58) Field of Classification Search
CPC . H05K 1/02; H05K 3/46; H01L 21/00; H01L 21/50; H01L 21/56; H01L 21/78; H01L 21/768; H01L 23/00; H01L 23/12; H01L 23/31; H01L 23/48; H01L 23/498; H01L 23/522; H01L 23/532; H01L 23/538

USPC ........ 174/258, 251; 438/106–108, 125, 127; 257/532, 621, 686, 700, 737, 750, 762, 257/774

See application file for complete search history.

(56) References Cited

U.S. PATENT DOCUMENTS

| | | | | |
|---|---|---|---|---|
| 3,955,068 A | * | 5/1976 | Shaheen | ................ B41J 2/3351 |
| | | | | 219/549 |
| 4,464,489 A | * | 8/1984 | Noda | ................... C08G 18/346 |
| | | | | 521/117 |

(Continued)

FOREIGN PATENT DOCUMENTS

WO   2014197028 A2   12/2014

OTHER PUBLICATIONS

Ma Meador et al., "Mechanically Strong, Flexible Polyimide Aerogels Cross-Linked with Aromatic Triamine", ACS Applied Materials & Interfaces, 2012.

(Continued)

*Primary Examiner* — Xiaoliang Chen
(74) *Attorney, Agent, or Firm* — Haynes and Boone, LLP (57) ABSTRACT

A substrate structure is presented that can include a porous polyimide material and electrodes formed in the porous polyimide material. In some examples, a method of forming a substrate can include depositing a barrier layer on a substrate; depositing a resist over the barrier layer; patterning and etching the resist; forming electrodes; removing the resist; depositing a porous polyimide aerogel; depositing a dielectric layer over the aerogel material; polishing a top side of the interposer to expose the electrodes; and removing the substrate from the bottom side of the interposer.

20 Claims, 7 Drawing Sheets

(56) References Cited

U.S. PATENT DOCUMENTS

| | | | |
|---|---|---|---|
| 4,532,620 A * | 7/1985 | Matsuda | H01F 17/0006 361/765 |
| 5,135,959 A * | 8/1992 | Hill | B29C 44/5618 264/51 |
| 5,149,615 A * | 9/1992 | Chakravorty | G03F 7/0035 205/125 |
| 5,231,751 A * | 8/1993 | Sachdev | H01L 21/486 216/18 |
| 5,300,735 A * | 4/1994 | Yokono | H01L 21/4857 174/250 |
| 5,582,858 A * | 12/1996 | Adamopoulos | C08G 73/1003 156/281 |
| 5,706,578 A * | 1/1998 | Hubner | H01L 25/0657 174/259 |
| 6,228,511 B1 * | 5/2001 | Sachdev | H01L 21/486 174/261 |
| 6,322,903 B1 | 11/2001 | Siniaguine et al. | |
| 6,338,984 B2 | 1/2002 | Minamio et al. | |
| 7,793,414 B2 | 9/2010 | Haba et al. | |
| 8,097,490 B1 * | 1/2012 | Pagaila | H01L 21/561 257/E21.007 |
| 8,159,043 B2 * | 4/2012 | Yamazaki | G06K 19/07749 257/531 |
| 8,618,659 B2 * | 12/2013 | Sato | H01L 23/3121 257/737 |
| 2001/0007788 A1 * | 7/2001 | Chang | H01L 21/7682 438/421 |
| 2003/0019568 A1 * | 1/2003 | Liu | B32B 7/12 156/245 |
| 2003/0080399 A1 * | 5/2003 | Hedler | H01L 21/561 257/678 |
| 2003/0199121 A1 * | 10/2003 | Caletka | H01L 21/563 438/113 |
| 2004/0101626 A1 * | 5/2004 | Kanada | C08J 9/26 427/385.5 |
| 2005/0074651 A1 * | 4/2005 | Kidai | H01M 8/1009 429/482 |
| 2005/0096661 A1 * | 5/2005 | Farrow | A61B 17/1628 606/79 |
| 2005/0109455 A1 | 5/2005 | Bai | |
| 2006/0208248 A1 | 9/2006 | Lee et al. | |
| 2006/0255480 A1 * | 11/2006 | Casey | H01L 21/486 257/788 |
| 2007/0035033 A1 | 2/2007 | Ozguz et al. | |
| 2008/0054444 A1 | 3/2008 | Tuttle | |
| 2008/0087870 A1 * | 4/2008 | Williams | B01J 13/0091 252/609 |
| 2008/0136035 A1 * | 6/2008 | Aggarwal | B81C 1/00619 257/762 |
| 2008/0164573 A1 * | 7/2008 | Basker | H01L 21/486 257/621 |
| 2008/0169546 A1 | 7/2008 | Kwon | |
| 2008/0315385 A1 | 12/2008 | Gerber | |
| 2008/0316714 A1 | 12/2008 | Eichelberger | |
| 2009/0014859 A1 * | 1/2009 | Jeung | H01L 21/4853 257/686 |
| 2009/0068831 A1 * | 3/2009 | Enquist | H01L 21/76898 438/618 |
| 2009/0166862 A1 | 7/2009 | Kweon et al. | |
| 2009/0200663 A1 | 8/2009 | Daubenspeck et al. | |
| 2009/0283898 A1 | 11/2009 | Janzen | |
| 2010/0144101 A1 * | 6/2010 | Chow | H01L 21/561 438/127 |
| 2010/0148360 A1 | 6/2010 | Lin | |
| 2010/0171205 A1 | 7/2010 | Chen | |
| 2010/0171207 A1 | 7/2010 | Shen | |
| 2010/0232129 A1 | 9/2010 | Haba et al. | |
| 2010/0237495 A1 * | 9/2010 | Pagaila | H01L 21/568 257/700 |
| 2010/0275617 A1 * | 11/2010 | Williams | B01J 13/0091 62/46.1 |
| 2011/0068468 A1 | 3/2011 | Lin | |
| 2011/0068478 A1 * | 3/2011 | Pagaila | H01L 21/568 257/774 |
| 2011/0156264 A1 | 6/2011 | Machida | |
| 2011/0210452 A1 | 9/2011 | Roozeboom et al. | |
| 2011/0256664 A1 * | 10/2011 | Pagaila | H01L 21/6835 438/108 |
| 2012/0056316 A1 * | 3/2012 | Pagaila | H01L 25/16 257/737 |
| 2012/0073859 A1 | 3/2012 | Lo et al. | |
| 2012/0189782 A1 | 7/2012 | Zafiropoulos et al. | |
| 2012/0228778 A1 | 9/2012 | Kosenko et al. | |
| 2012/0267777 A1 * | 10/2012 | Haba | H01L 25/0652 257/737 |
| 2013/0014978 A1 | 1/2013 | Uzoh et al. | |
| 2013/0046368 A1 | 2/2013 | Storey | |
| 2013/0113116 A1 | 5/2013 | Chen | |
| 2013/0178062 A1 * | 7/2013 | Enquist | H01L 21/76898 438/667 |
| 2013/0270682 A1 | 10/2013 | Hu et al. | |
| 2013/0313716 A1 * | 11/2013 | Mohammed | H01L 24/18 257/774 |
| 2014/0036454 A1 * | 2/2014 | Caskey | H05K 1/0298 361/735 |
| 2014/0187040 A1 * | 7/2014 | Enquist | H01L 21/76898 438/667 |
| 2014/0203443 A1 * | 7/2014 | Pagaila | H01L 21/568 257/773 |
| 2014/0252646 A1 * | 9/2014 | Hung | H01L 23/481 257/774 |
| 2014/0265057 A1 * | 9/2014 | Park | G21F 1/026 264/544 |
| 2014/0272358 A1 * | 9/2014 | Meador | C08J 9/00 428/219 |
| 2015/0141544 A1 * | 5/2015 | Meador | C08G 73/101 521/183 |
| 2015/0262902 A1 * | 9/2015 | Shen | H01L 23/315 438/107 |
| 2016/0003404 A1 * | 1/2016 | Shibata | C04B 38/00 428/192 |
| 2016/0079169 A1 * | 3/2016 | Uzoh | H01L 23/5328 257/750 |

OTHER PUBLICATIONS

H. Guo et al., "Polyimide Aerogels Cross-Linked through Amine Functionalized Polyoligomeric Silsesquioxane", ACS Applied Materials & Interfaces, Feb. 4, 2011.

U.S. Appl. No. 14/214,365 titled, "Integrated Circuits Protected by Substrates With Cavities, and Methods of Manufacture," filed Mar. 14, 2014, 40 pages.

U.S. Appl. No. 61/952,066 titled, "Integrated Circuits Protected by Substrates with Cavities, and Methods of Manufacture," filed Mar. 12, 2014, 35 pages.

Notification of Transmittal and International Search Report for PCT/US2016/026226 dated Jul. 13, 2016. 5 pages.

Written Opinion for PCT/US2016/026226 dated Jul. 13, 2016. 6 pages.

* cited by examiner

HIGH PERFORMANCE COMPLIANT SUBSTRATE

BACKGROUND OF THE INVENTION

Technical Field

Embodiments of the present invention relate High Performance Interposers.

Discussion of Related Art

In Chip-first approach, the die are flip-chip mounted on a thick interposer wafer and then molded. In addition to providing electrical connections through the interposer, thermal insulation and warpage characteristics are also considered. Therefore, interposers should have good mechanical and thermal characteristics in order to both thermally insulate between devices mounted on the interposer and to reduce warpage of the final package.

Therefore, there is a need for high performance interposers and substrates.

SUMMARY

In accordance with aspects of the present invention, a substrate structure can include a porous polyimide material; and electrodes formed in the porous polyimide material. A method of forming a substrate can include depositing a barrier layer on a substrate; depositing a resist over the barrier layer; patterning and etching the resist; forming electrodes; removing the resist; depositing a porous polyimide aerogel; depositing a dielectric layer over the aerogel material; polishing a top side of the interposer to expose the electrodes; and removing the substrate from the bottom side of the interposer.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various mechanical, compositional, structural, and operational changes may be made without departing from the spirit and scope of this description and the claims. In some instances, well-known structures and techniques have not been shown or described in detail in order not to obscure the invention.

Additionally, the drawings are not to scale. Relative sizes of components are for illustrative purposes only and do not reflect the actual sizes that may occur in any actual embodiment of the invention. Like numbers in two or more figures represent the same or similar elements.

Figure 1:
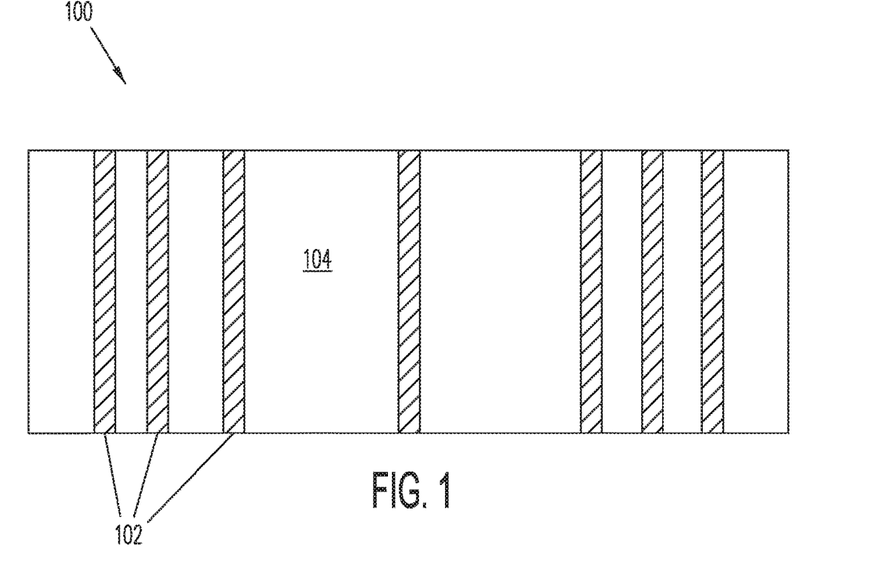
FIG. 1 illustrates an example interposer according to some embodiments of the present invention.

FIG. 1 illustrates an interposer or substrate 100 according to some embodiments of the present invention. As shown in FIG. 1, interposer or substrate 100 is formed by electrodes 102 embedded in a porous polyimide or in a mesoporous layer or material 104. Porous polyimide or mesoporous material 104 provides high thermal performance, high mechanical strength, as well as the ability to blunt stress fields and blunt propagating cracks. The ability to block cracks suppresses the propagation of cracks emanating from the topside or bottom side of material 104. In some embodiments, the material 104 may deform locally to cushion the large stresses generated by the various mechanical and electrical elements it supports.

Most aerogel products currently available are silica based and break down on handling, shedding small dust particles. Consequently, most conventional aerogels are encapsulated to prevent the dust. Additionally, the insulation properties of the aerogel degrade significantly over time. However, material 104 can be, for example, formed from a porous polyimide aerogel. Polyimide aerogels are flexible, mechanically robust and do not shed dust. Further, polyimide aerogels have good thermal conductivity and dielectric properties.

One polyimide aerogel has been developed by NASA and is described more fully in "Mechanically Strong, Flexible Polyimide Aerogels Cross-Linked with Aromatic Triamine" by Mary Ann B. Meador, Ericka J. Malow, Rebecca Silva, Sarah Wright, Derek Quade, Stephanie L. Vivod, Haiquan Guo, Jiao Guo, and Miko Cakmark, *ACS Applied Materials & Interfaces*, Sep. 6, 2012 and "Polyimide Aerogels Cross-Linked through Amine Functionalized Polyoligomeric Silsesquioxane" by Haiquan Guo, Mary Ann B. Meador, Linda McCorkle, Derek Quade, Jiao Guo, Bart. Hamilton, Miko Cakmak, and Guilherme Sprowl, *ACS Applied Materials & Interfaces*, Feb. 4, 2011. Polyimide aerogels can be manufactured as a thin film, which can be flexible and yet maintain excellent tensile properties. Polyimide aerogels can be about 500 times stronger than traditional silica aereogels. Polyimide aerogels can be custom manufactured as thicker parts with no need to encapsulate or layer on a flexible matrix. In some embodiments, polyimide aerogels can have low thermal conductivity, for examples k values of 14-20 mW/m-K, which offers 2-5 times improved performance over polymer foams. The R values can range from 2-10 times higher than polymer foams, which is in line with silica aerogels of the same density. Polyimide aerogels can be composed of more than 95 percent air by volume and have densities as low as 0.08 g/cm$^3$. Polyimide aerogels can withstand temperatures up to 300° C.

In some embodiments, polyimide gels can be formed from combinations of diamine and dianhydride. For example, a combination of polyamic acid solutions of 3,3', 4,4'-biphenyltetracarboxylic dianhydride (BPDA), bisaniline-p-xylidene (BAX) and OAPS that are chemically imidized and dried using supercritical $CO_2$. The polyimide gels can be cross-linked through a polyhedral oligomeric silsesquioxane (POSS) or aromatic triamine (TAB).

Polyimide aerogels can have a density as low as 0.08 g/cm$^3$, prosity greater than 90%, dielectric constant (X-band between 1.1 and 1.3), and Young's Modulas of 1-100 MPa depending on density.

The thermal conductivity of polyimide aerogels such as those used in the present embodiments, at room temperature, is about k=14 mW/m-K. This thermal conductivity is very low. For comparison, the thermal conductivity of various materials is provided in the following table:

| Material | Thermal conductivity (k in units of mW/m-K) |
|---|---|
| Polyimide Aerogel | 14-20 |
| Air | 24 |
| Carbon dioxide | 14.6 |
| fiberglass | 40 |
| Argon | 16 |
| Foam glass | 45 |
| glass | 1050 |
| gold | 310 × 10$^3$ |

Figure 2:
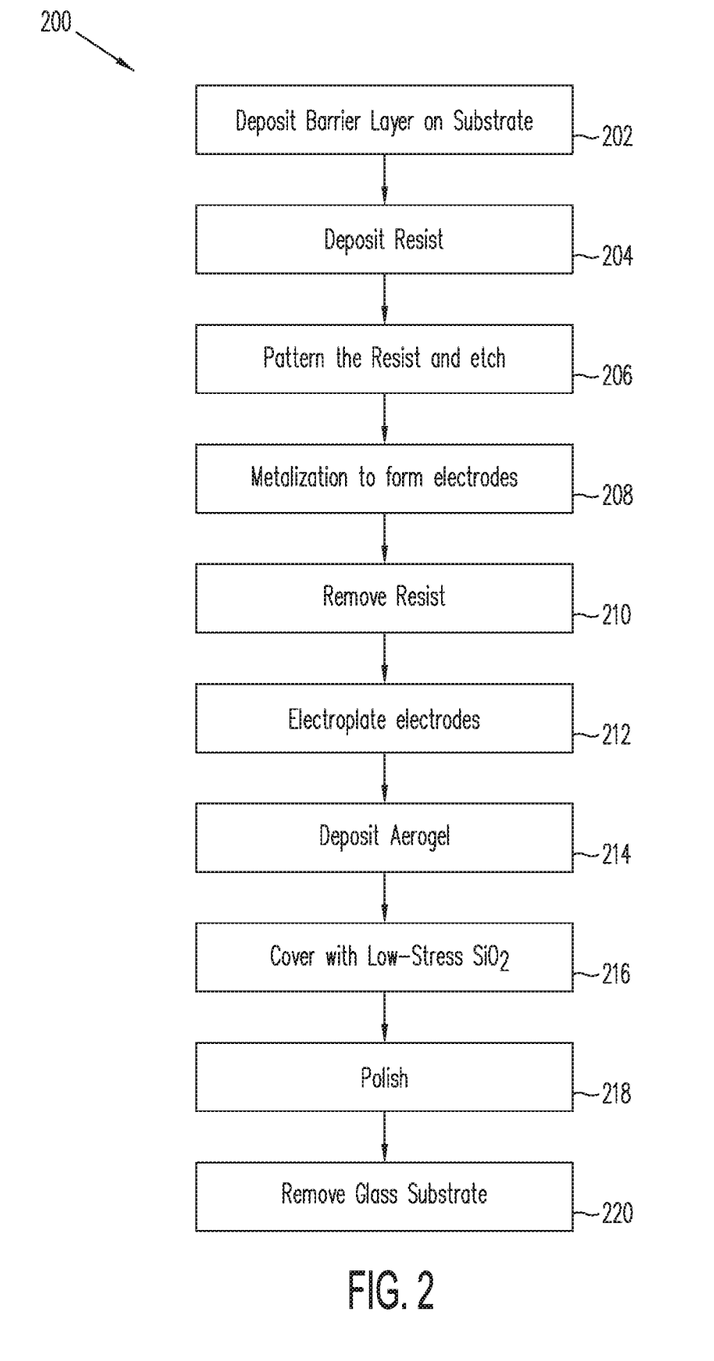
FIG. 2 illustrates a process for forming the example interposer illustrated in FIG. 1.
Figure 3A:
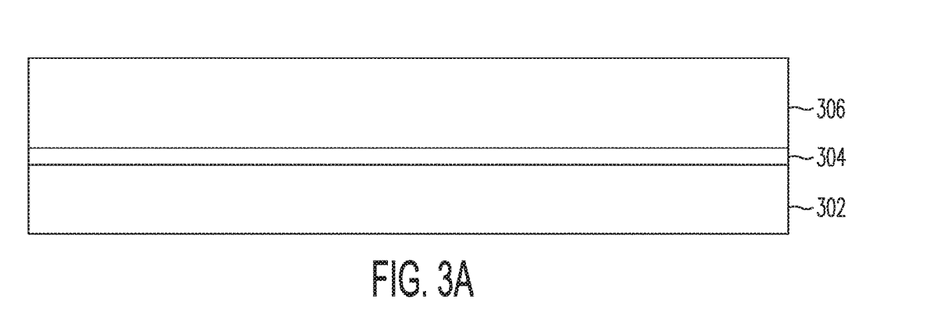
FIGS. 3A through 3F illustrate structurally the process shown in FIG. 2.

FIGS. 2 and 3A through 3F illustrate an example process for producing interposer 100 as illustrated in FIG. 1. As illustrated in FIGS. 2 and 3A, in step 202 a barrier layer 304 is deposited on a substrate 302. Substrate 302, for example, can be a dummy substrate or a silicon glass substrate. In some cases, substrate 302 can include active or passive devices. In some embodiments, substrate 302 may include blind cavities or recesses. Barrier layer 304 can be, for example, a Ni barrier layer, a TaN/Ta layer, a NiP layer, or a TiN layer, which is coated over the top surface of substrate 302. In some applications, the barrier layer may comprise of a dielectric material or combination of a dielectric layer and a conductive layer. In some embodiments, a seed layer (not shown) can be provided over barrier layer 304 if needed. For example if barrier layer 304 is a platable material for example, nickel and some copper alloys, a seed layer may not be necessary. In step 204, a resist layer 306 can be deposited over barrier layer and/or seed layer 304. In some embodiments, layer 304 may comprise a distribution layer or interconnection layers for example BEOL. The interconnection layer can be capped with a dielectric layer. The dielectric can be patterned to expose electrical and or mechanical interconnection features beneath prior to seed layer coating and the formation of the resist layer.

Figure 3B:
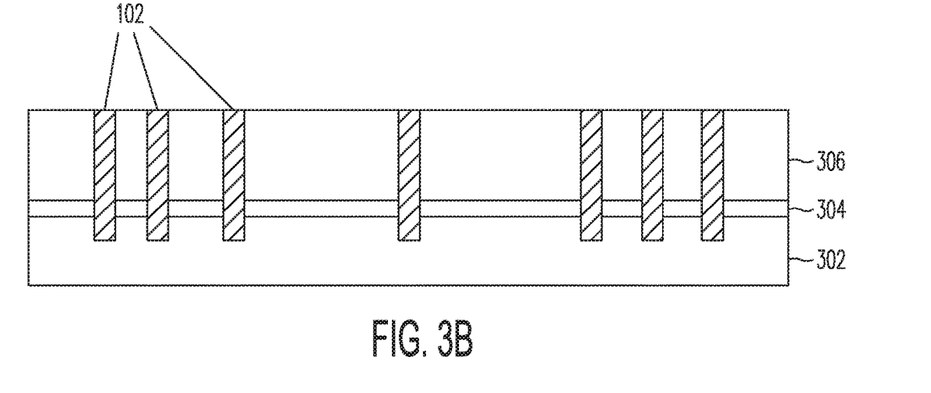
Figure 3C:
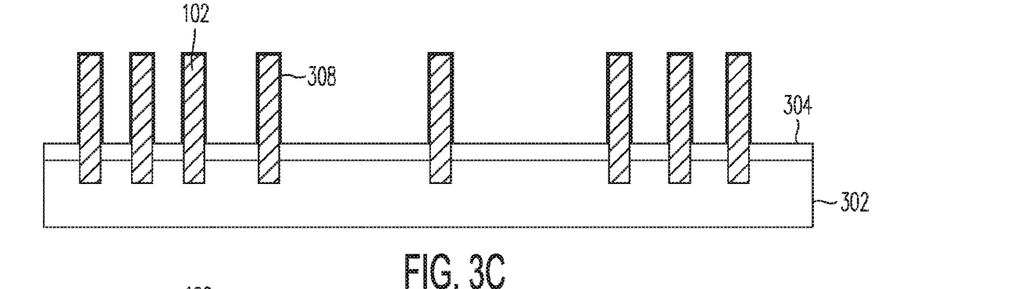

As shown in FIG. 2 and FIG. 3B, in step 206 resist layer 306 is patterned and in step 208 metal, for example copper, is deposited to form electrodes 102. In step 210, resist layer 306 is removed, barrier layer 304 (along with the seed layer if present) are removed selectively without removing significant portions of the plated feature 102. In step 212 and as shown in FIG. 3C, electrodes 102 can be coated, for example, with another barrier layer 308. Barrier layer 308 may be formed by selective or non-selective methods. In some embodiments, barrier layer 308 may be a conducting material formed by electroless methods, for example coating nickel or nickel alloys such as NiP, NiW, cobalt and cobalt alloys and combinations thereof on the plated structure 102. In other embodiments the barrier layer may be an insulator formed by PECVD or ALD or other known methods. The insulating barrier layer 308 may be formed of SiN, SIC, diamond like carbons (DLC). In some embodiments, the conductive material 102 can include wirebond. For example, the wirebond may be formed on exposed interconnection features. The conductive wirebond material may include Au, Ni, Cu and their various alloys and a clad layer or layers.

Figure 3D:
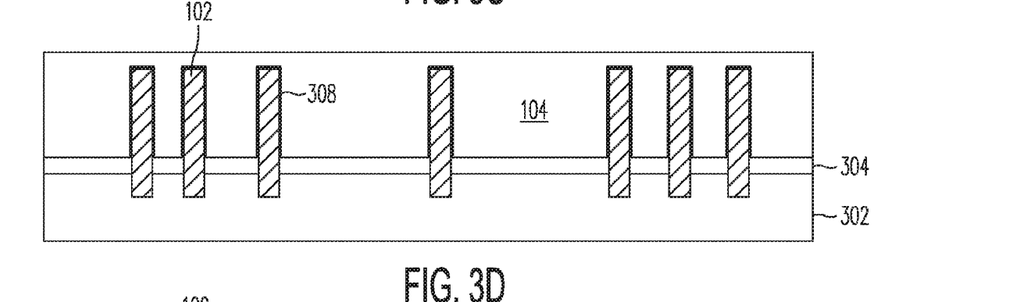

When the conductive feature 102 is gold, the barrier layer 308 may not be needed. In some embodiments, conductive layer or layers can be formed by sputtering or electroplating methods or both. The said layer can be also formed by metal lamination methods. For example, a continuous conducting sheet is formed and then patterned to create structures such as those shown in FIG. 3C. In some applications, the metal etching is formed by using anisotropic etchants for the conductive features 102 and any traces of interest. For example, if the coated layer 102 comprise of titanium-aluminum-titanium laminate, chloride ions RIE plasma can be used to remove the unwanted portions of the blanket conductive layer to form at least features 102. In some applications, anisotropic metal removing formularies in the presence of electric field can be used to form conductive features 102 with aspect ratio (H/W) greater than 1.5. In step 214 and as shown in FIG. 3D, a foam material 104 is formed. In some embodiments, as discussed above, foam material 104 can be a polyimide aerogel or a mesoporous material. A polyimide aerogel can be spin-deposited and cured. In some embodiments, curing involves a heating step. In some embodiments mesoporous material other the polyimide aerogel may be used or used in combination with polyimide aerogel. In some embodiments, the dielectric constant k of the mesoporous layer can be less than 2.

In some embodiments, the coated metal 102 protrudes beyond the surface of the coated polymer aerogel. For example, the coated metal 102 may protrude at least more than 1 micron over the surface of the formed aerogel. A removal may be performed to expose the conductive electrode 102 on the top prior to the attachment of device 404. In certain embodiments, metal features 102 may not extend through the foam material, e.g. where damascene, conductive lines, traces, or other conductive features are desired. Moreover, while metal features 102 are shown extending through layers 302 and 304, this is not required and the features may not protrude through either or both of these layers.

Figure 3E:
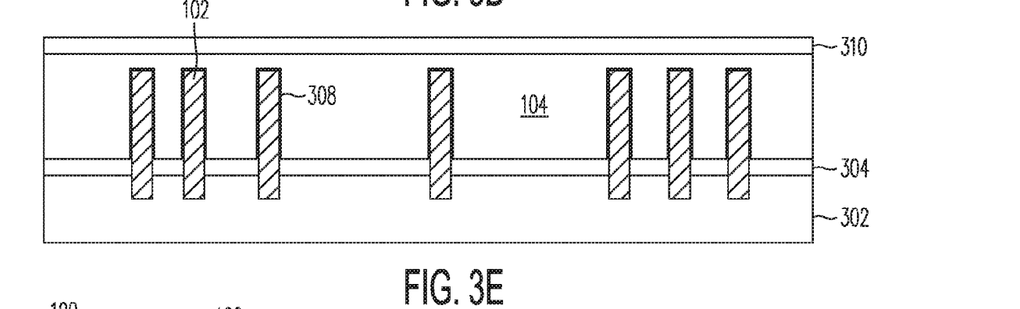

In some embodiments, in step 216, a low-stress dielectric layer for example a Si-containing layer 310 is deposited over foam 104 as shown in FIG. 3E. Low-stress layer 310 can be, for example, a SiO$_2$ layer, a SiN layer, a SiON layer, a SiOF layer, a SiC layer, a diamond like carbon (DLC), a polyimide or combinations thereof. In step 218, a polish step is performed to expose electrodes 102 on the top. The coated dielectric layer may comprise the distribution layer. Portions of the distribution layer may be disposed beneath the exposed conductive electrode 102 and other portions over electrode 102, One or more metallization layers may be coated within the dielectric. In some applications a contact pad structure (not shown) is coated over the appropriate conductors 102. Semiconductor devices 404 (see FIG. 4) and/or passive circuit elements (not shown) may be attached to the top of material 104.

In some embodiments, the mesoporous layer of material 104 may be disposed over the seed layer 304. Cavities are then formed in the mesoporous layer material 104 by RIE methods or by ablation using laser beam for example. The exposed seed layer is cleaned and the conductive electrode is formed by plating methods or screen printing or particle filling methods, prior to subsequent steps. For example solder balls or particles may be deposited in the cavities in material 104. The material 104 is thermal treated to fuse the solder material within the cavity. Any unwanted solder or other materials on the surface of material 104 is removed. In some applications, the removal step can comprise of high precision milling step to remove for example the top five (5) microns of material 104.

In some embodiments, the attached devices can be encapsulated, for example by transfer molding methods. In some embodiments the Young's modulus of the encapsulant material is higher than that of aerogel material 104. In some embodiments, the Young's modulus of the encapsulant is similar to that of the aerogel material 104. In some embodiments, the Young's modulus of the encapsulant is lower than that of the aerogel 104. In some embodiments, the encapsulant can be mesoporous material. The top surface of the encapsulant may be polished if necessary to further reduce the thickness of the die and encapsulant. The encapsulated structures can be separated from the support layer 302 and any unwanted material on 104 can be removed including the original plating seed layer to expose the conductive feature 102.

Porous polyimide or mesoporous material 104 provides high thermal performance, high mechanical strength and the ability to blunt stress fields and blunt propagating cracks. The ability to block cracks suppresses the propagation of cracks emanating from disposed on the topside or bottom side of material 104. In some embodiments, the material 104 may deform microscopically locally to cushion the large stresses generated by the various mechanical and electrical elements it supports. The suppression of stress fields and crack propagation in microelecronic packages improves the yield and reliability of the entire package or packaged devices.

The top surface may be attached to a support layer to remove the support layer 302. In some applications where the support layer comprise of embedded conductor 102, the support layer 302 may thinned down by known methods and processed to reveal the bottom side of the electrodes 102 in the remaining support layer 302 (not shown). Other structures may be attached to the backside of the support layer. The other structures may include a board, a substrate, a chip, a cooling element or another interposer.

Figure 3F:
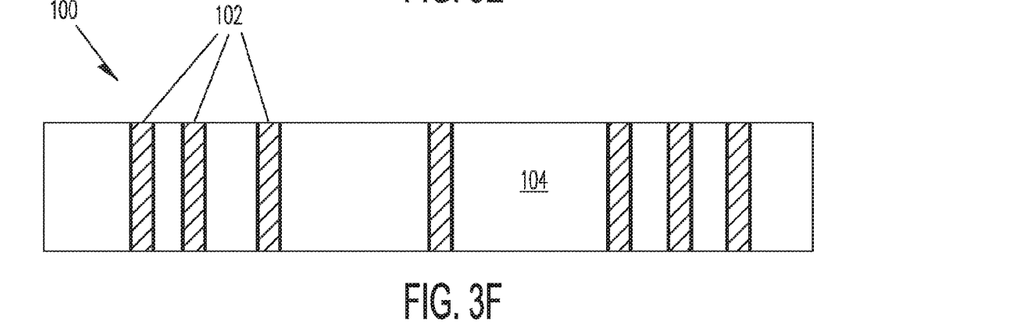

In step 220, as illustrated in FIG. 3F, glass substrate 302 and any unwanted materials are removed to expose electrodes 102 on the bottom.

Figure 4A:
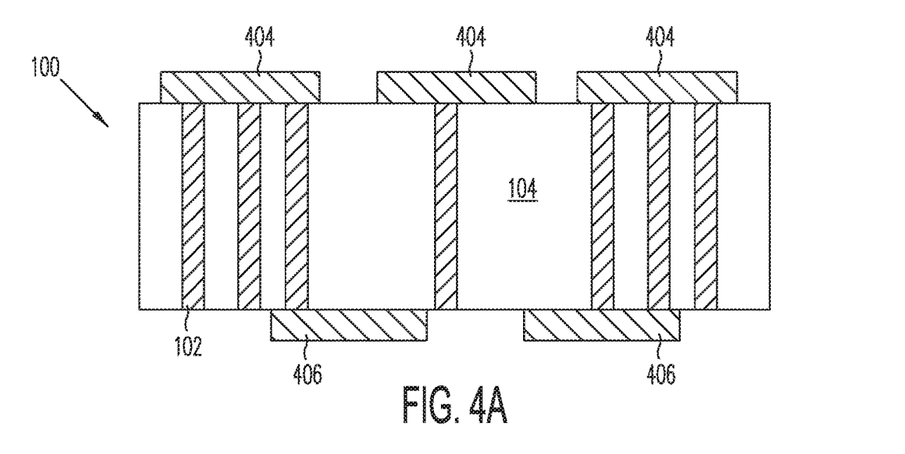
FIGS. 4A through 4H illustrates various configurations using interposers according to some embodiments of the present invention.
Figure 4B:
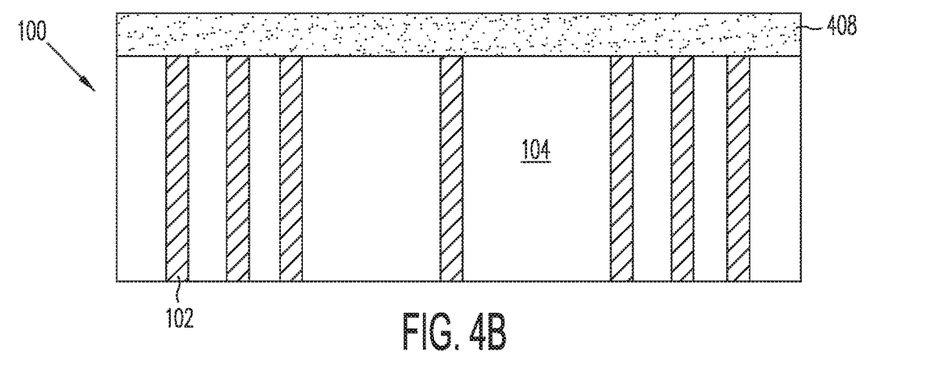
Figure 4C:
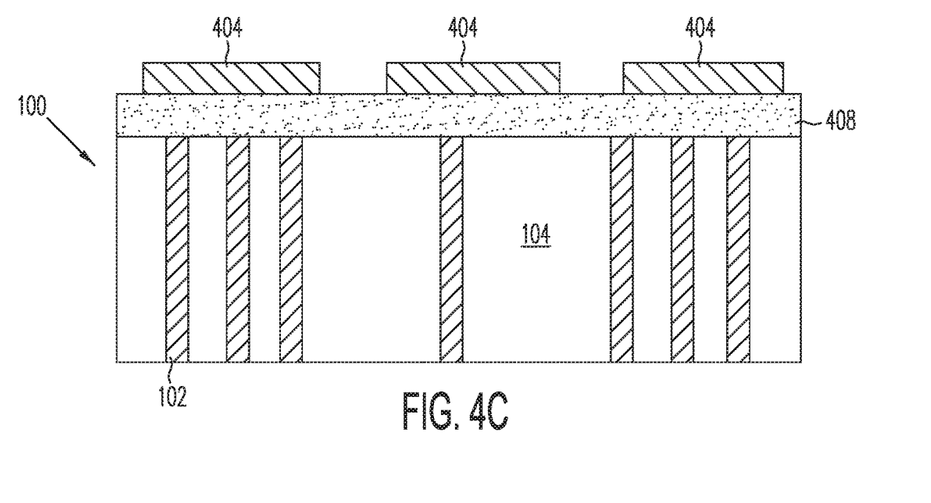

FIGS. 4A through 4H illustrate various configurations using an interposer or substrate 100 according to some embodiments of the present invention. FIG. 4A illustrates a configuration with devices 404 attached to a top side of interposer 100 and devices 406 attached to a bottom side of interposer 100. FIG. 4B illustrates a configuration with a layer 408 deposited on a top side of interposer 100. Layer 408 can be a redistribution layer (RDL) or a back end-of-line layer (BEOL) and can also be formed using polyimide aerogel or a low K material as the dielectric in the RDL or BEOL structure. FIG. 4C illustrates a configuration with layer 408 and devices 404 attached on layer 408. The advantages of these configurations result from the electrical insulation in interposer 100 formed from low k material (k<1), the thermal barrier provided by interposer 100, and flexible and conformal electronics.

Additionally, the porous polyimide or mesoporous material 408 provides high mechanical strength and also blunts stress fields and blunts propagating cracks that may originate from the presence of devices 404. In some embodiments, the layer 408 may deform microscopically locally to cushion the large stresses generated by the presence of various devices 404 and electrical elements 102. The suppression of stress fields and crack propagation protects the devices 404 from cracking and experiencing stress fields from neighboring devices in microelectronic packages.

In some embodiments, there are no conducting thru-electrodes in the polyimide aerogel or mesoporous layer 104. Conductive features can be formed in the patterned mesoporous layer 104 by damascene or non-damascene method or by combination of both methods. A suitable dielectric layer or the polyimide aerogel or polyimide layer can be used to fabricated multilevel metallization feature over the layer 104. Various homogenous and/or heterogeneous devices may be assembled or attached or couple electrically and mechanically to the metallization features or pads disposed over layer 104. The various attached said devices communicate with each other through the interconnect layer disposed over layer 104. In some embodiments, active or passive devices can be embedded in layer 104 and the embedded devices can communicate with other devices via their terminals exposed on the top or bottom surface of layer 104.

Figure 4D:
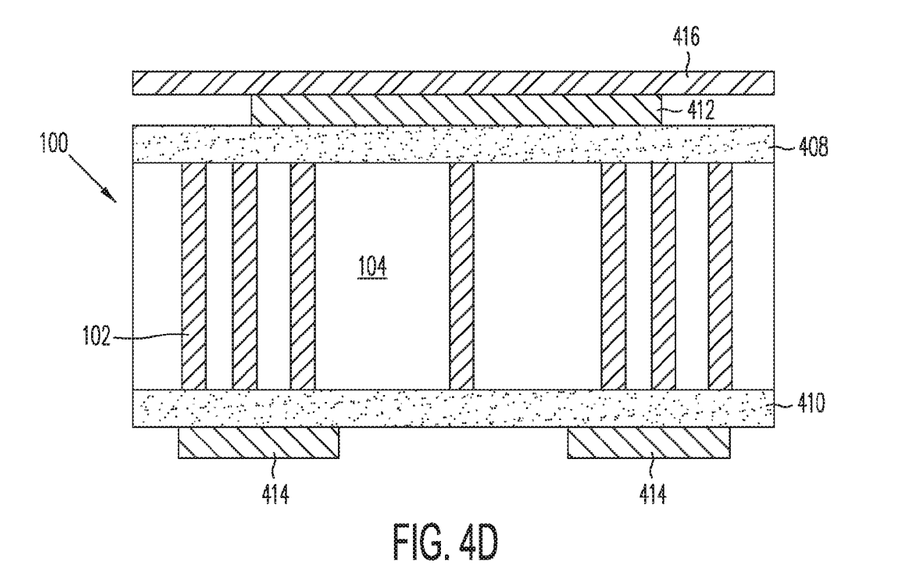
Figure 4E:
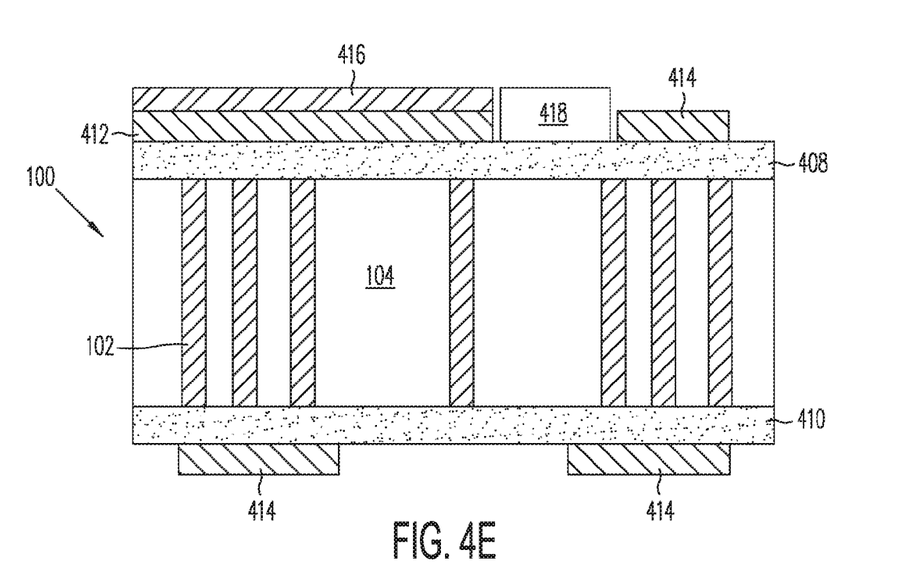

FIGS. 4D and 4E illustrate a configuration that keeps memory cool from the heating of a microprocessor. As shown in FIG. 4D, a top layer 408, which can be an RDL or BEOL, is deposited on top of interposer 100 while a bottom layer 410, which also can be an RDL or BEOL formed with polyimide aerogel, is deposited on the bottom side of interposer 410. A microprocessor or a graphics microprocessor 412 is attached to top layer 408. Memory 414 is attached to bottom layer 410. An optional heat sink 416 can be attached on top of microprocessor 412. In this configuration, memory 414 is well insulated thermally from microprocessor 412 while electrical contact is between microprocessor 412 and memory 414 is made through top layer 408, bottom layer 410, and interposer 100. In some embodiment, the device 414 can be located on the same surface as the heat generating device 412, but further away, for example by more than 100 microns, from device 412 without causing higher warpage in the interposer 100. In some applications, the second device 414 can be located more than 200 microns from the first device and the said device relative disposition not degrading interposer or substrate warpage.

FIG. 4E shows a configuration where a memory 414 is deposited to the top side of layer 408 with microprocessor 412 and is separated from microprocessor 412 by a spacer 418. Spacer 418 can be formed of porous polyimide or a mesoporous layer or their combination on top layer 408 between microprocessor 412 and memory 414. Again, memory 414 placed on top layer 408 is thermally insulated from microprocessor 412 while also making electrical contact through metallization in top layer 408. An optional heat sink 416 can be attached on top of microprocessor 412 to further remove heat.

Figure 4F:
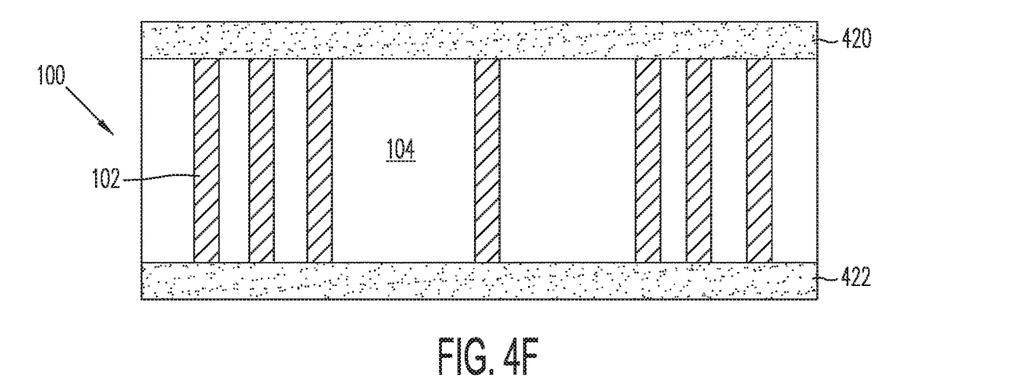
Figure 4G:
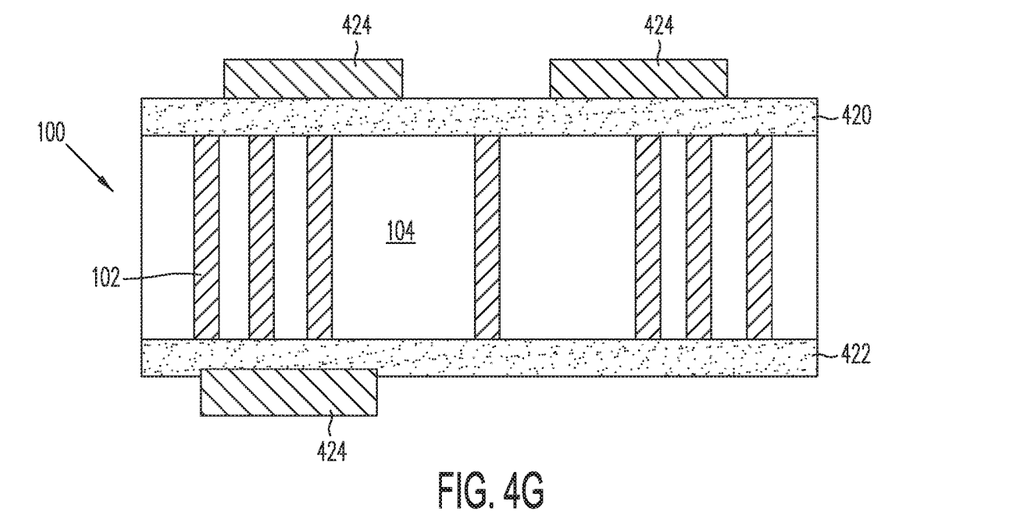

FIGS. 4F and 4G illustrate a configuration where the top layer 420 comprises a layer containing high modulus fiber layer 420 and a bottom layer 422 comprising a layer similar to the top layer 420 on the interposer 100. Top fiber layer 420 and bottom fiber layer 422 can be high-Young's modulus fiber composite layers (for example Kevlar) that provide additional structural stiffness to interposer 100. The layers 420 and 422 may be continuous or discontinuous and the layer layers 420 and 422 may be thicker in some regions or portions of the surface than in other areas. For example, in some applications, the layer 420 or 422 or both may be selectively disposed around the periphery of the top surface and bottom surface of layer 104. FIG. 4G illustrates devices 424 attached to top fiber layer 420 and bottom fiber layer 422. The fiber layers can help provide for a low warpage interposer. Conductive path ways, not shown, may be formed through layer 420 and contact pads formed over the conductive pathways. Device 424 may be attached on the formed contact pads.

Figure 4H:
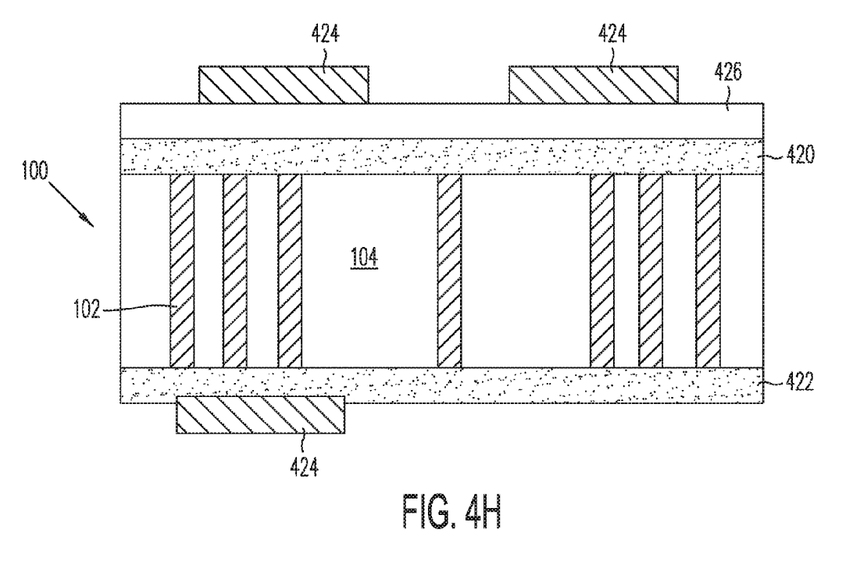

FIG. 4H illustrates addition of a top layer 426 over top fiber layer 420. Top layer 426 can be, for example, an RDL layer, which also may be formed from porous polyimide. Devices 424 can then be attached to top layer 426. In some embodiments, fiber layer 420 is a good thermal conductor. Conductive path ways, not shown, may be formed through layers 420 and 426 with contact pads formed over the conductive pathways. Device(s) 424 may be attached on the formed contact pads.

In other embodiments of this invention layer 104 comprise a mesoporous inorganic material formed by aerogel and thermal methods. In one application the Young's modulus of the inorganic mesoporous layer 104 is higher than the dielectric layer formed on the top or bottom surface of the mesoporous layer 104. While the implementations described above generally indicate that the metal features 102 are formed and patterned before foam layer 104 is formed, this is not a requirement. The foam layer 104 maybe formed first with openings formed therein. The metal features 102 may then be formed within the openings as described above, e.g. with regard to FIG. 3B.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A method of forming an interposer, comprising:
   providing electrodes on a substrate;
   depositing a porous polyimide aerogel between at least two adjacent electrodes; and
   removing the substrate from the interposer;
   wherein said providing electrodes includes:
      depositing a resist over the substrate;
      patterning and etching the resist;
      forming the electrodes defined using the patterned and etched resist, at least part of the electrodes being part of the interposer; and
      removing the resist;
   wherein the method further includes:
      depositing a low-stress layer over the polyimide aerogel; and
      polishing a top side of the interposer to expose the electrodes.

2. The method of claim 1, further including depositing a barrier layer over the substrate before depositing the resist, wherein the resist is deposited over the barrier layer.

3. The method of claim 1, wherein forming the electrodes includes electroplating the electrodes in one or more cavities formed by patterning and etching the resist.

4. The method of claim 3, wherein said electroplating the electrodes includes electroplating at least one of copper, nickel, aluminum, tungsten.

5. The method of claim 1, further including coating at least parts of the electrodes with a barrier layer before depositing the porous polyimide aerogel, wherein the porous polyimide aerogel is deposited over the barrier layer formed over the electrodes in said coating.

6. The method of claim 1, wherein depositing the porous polyimide aerogel includes spin-coating the polyimide aerogel and curing the polyimide aerogel.

7. The method of claim 1, wherein depositing the low-stress layer includes depositing a silicon bearing layer over the porous polyimide aerogel.

8. The method of claim 1, further including depositing a redistribution layer on the top side of the interposer.

9. The method of claim 1, further including depositing a redistribution layer on the bottom side of the interposer.

10. The method of claim 1, further including depositing a high-performance fiber layer on the top side or the bottom side of the interposer.

11. The method of claim 1 wherein the porous polyimide aerogel is deposited after said providing the electrodes on the substrate.

12. A method of forming an interposer, comprising:
    providing electrodes on a substrate; then depositing a porous polyimide aerogel between at least two adjacent electrodes; and
    removing the substrate from the interposer.

13. The method of claim 12 wherein depositing the porous polyimide aerogel comprises:
    depositing the porous polyimide aerogel to cover the electrodes; and then removing a portion of the porous polyimide aerogel to expose tops of the electrodes.

14. The method of claim 13 wherein said removing the portion of the porous polyimide aerogel is performed by polishing.

15. The method of claim 12 further comprising:
    attaching circuit components to the interposer above the interposer, the interposer comprising the porous polyimide aerogel and the electrodes; and
    attaching a porous spacer above the interposer between the circuit components to improve thermal insulation between the circuit components.

16. The method of claim 15 wherein at least one of the circuit components comprises a microprocessor, and at least one other one of the circuit components is a memory.

17. The method of claim 12 further comprising, before said depositing the porous polyimide aerogel, coating at least parts of the electrodes with a barrier layer, the porous polyimide aerogel being then deposited over the barrier layer.

18. The method of claim 17 wherein the barrier layer separates the electrodes from the porous polyimide aerogel in the interposer.

19. The method of claim 17 wherein the barrier layer is conductive.

20. The method of claim 12 further comprising, before said depositing the porous polyimide aerogel, coating at least parts of the electrodes with a dielectric layer, the porous polyimide aerogel being then deposited over the dielectric layer and being separated from the electrodes by the dielectric layer.

* * * * *